(12) United States Patent
Lee et al.

(10) Patent No.: US 9,251,912 B2
(45) Date of Patent: Feb. 2, 2016

(54) SEMICONDUCTOR MEMORY DEVICE AND METHOD OF WAFER BURN-IN TEST FOR THE SAME

(71) Applicant: SK hynix Inc., Gyeonggi-do (KR)

(72) Inventors: Hyun-Sung Lee, Gyeonggi-do (KR); Kee-Teok Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/280,178

(22) Filed: May 16, 2014

(65) Prior Publication Data
US 2015/0155054 A1 Jun. 4, 2015

(30) Foreign Application Priority Data
Dec. 3, 2013 (KR) .................. 10-2013-0149197

(51) Int. Cl.
| | | |
|---|---|---|
| G11C 29/00 | (2006.01) | |
| G11C 29/50 | (2006.01) | |
| G11C 29/12 | (2006.01) | |
| G11C 7/12 | (2006.01) | |
| G11C 29/02 | (2006.01) | |
| G11C 11/4091 | (2006.01) | |
| G11C 7/14 | (2006.01) | |
| G11C 29/08 | (2006.01) | |
| G11C 11/4099 | (2006.01) | |
| G11C 11/4094 | (2006.01) | |
| G11C 29/06 | (2006.01) | |
| G11C 29/24 | (2006.01) | |

(52) U.S. Cl.
CPC ............... *G11C 29/006* (2013.01); *G11C 7/12* (2013.01); *G11C 7/14* (2013.01); *G11C 11/4091* (2013.01); *G11C 11/4094* (2013.01); *G11C 11/4099* (2013.01); *G11C 29/02* (2013.01); *G11C 29/06* (2013.01); *G11C 29/08* (2013.01); *G11C 29/12* (2013.01); *G11C 29/24* (2013.01); *G11C 29/50* (2013.01); *G11C 2029/1202* (2013.01); *G11C 2029/1204* (2013.01)

(58) Field of Classification Search
CPC .......... G11C 7/14; G11C 29/50; G11C 29/02; G11C 29/08; G11C 29/12; G11C 11/4091; G11C 11/4099; G11C 11/4094; G11C 7/12
USPC ............... 365/185.23, 185.18, 185.2, 230.06, 365/210.1
See application file for complete search history.

(56) References Cited

U.S. PATENT DOCUMENTS

| | | | | |
|---|---|---|---|---|
| 5,682,343 | A * | 10/1997 | Tomishima | ........ G11C 11/4096 365/189.15 |
| 5,880,624 | A * | 3/1999 | Koyanagi et al. | ............. 327/541 |
| 6,297,999 | B2 * | 10/2001 | Kato et al. | ................... 365/201 |
| 8,687,403 | B1 * | 4/2014 | Derhacobian | ...... G11C 13/0007 365/100 |
| 2002/0054503 | A1 * | 5/2002 | Lee | ......................... G11C 7/12 365/149 |

(Continued)

FOREIGN PATENT DOCUMENTS

| | | |
|---|---|---|
| KR | 1020060082941 | 7/2006 |
| KR | 1020090110085 | 10/2009 |

*Primary Examiner* — Hoai V Ho
*Assistant Examiner* — Roberto Mancera
(74) *Attorney, Agent, or Firm* — IP & T Group LLP

(57) ABSTRACT

A semiconductor memory device comprising a memory cell array with a plurality of word lines, first and second dummy word lines, and a dummy word line driver suitable for separately driving the first and second dummy word lines for a wafer burn-in test where the word lines are driven by group.

7 Claims, 5 Drawing Sheets

(56) References Cited

U.S. PATENT DOCUMENTS

2005/0278592 A1* 12/2005 Yamada et al. ............... 714/721

2006/0092719 A1* 5/2006 Fujita ................. G11C 11/4091
365/189.06

* cited by examiner

SEMICONDUCTOR MEMORY DEVICE AND METHOD OF WAFER BURN-IN TEST FOR THE SAME

CROSS-REFERENCE TO RELATED APPLICATIONS

The present application claims priority of Korean Patent Application No. 10-2013-0149197, filed on Dec. 3, 2013, which is incorporated herein by reference in its entirety.

BACKGROUND

1. Field

Exemplary embodiments of the present invention relate to semiconductor design technology, and more particularly, to a method of wafer burn-in test and a semiconductor memory device for the same.

2. Description of the Related Art

An analysis of defective semiconductor products shows a high failure rate early in the products' life followed by stabilization. In order to stabilize the failure rate of early stage semiconductor products, the products are stressed in advance. Stressing the packaged semiconductor product requires exposure to high temperatures for a long duration, a process referred to as a burn-in test.

As the capacity of semiconductor memory increases, more time is required to complete the burn-in test for package level semiconductor products. To reduce the total amount of time required to conduct the burn-in test, the semiconductor product completes two burn-in tests, once at a wafer level and again at a package level. During the wafer burn-in test, the semiconductor memory is stressed with a high voltage supply and long-term exposure to high temperatures.

During the wafer burn-in test, all of the cell transistors are simultaneously turned on because the wafer burn-in test is not for checking normal operation of each cell in the wafer but for stressing the wafer out. To simultaneously turn on all of the cell transistors, the wafer is given high peak current. When the amount of peak current is not large enough, all of the cell transistors may not be simultaneously turned on and the wafer may not be fully stressed, resulting in an incomplete or failed wafer burn-in test.

Causes of early stage product failure may exist on defects in the dielectric structure, i.e., oxide between adjacent word lines as well as oxide between a gate and a channel.

A memory cell array is the smallest unit of cell groups in the semiconductor memory. The memory cell array includes a plurality of word lines, disposed within a certain interval, and a plurality of bit lines disposed within a certain interval, with the plurality of bit lines being perpendicular to the plurality of word lines. The memory cell array includes a normal cell, from which data is to be written and read during operation of the memory cell, and a dummy cell disposed outside the normal cell area for protecting the normal cell from external interference. Dummy cells include an upper set of dummy cells, each of which is connected at its gate to an upper dummy word line disposed at the upper border of the memory cell array, and a lower set of dummy cells, each of which is connected at its gate to a lower dummy word line disposed at the lower border of the memory cell array.

During normal semiconductor memory operation, all of the dummy word lines are provided with a negative word line voltage or a pumping voltage in a specific mode. The dummy word lines are not individually controlled but are provided with a single voltage. The memory cell array may have one or more upper dummy word lines and one or more lower dummy word lines. Biases of all the dummy word lines are combined and thus all of the dummy word lines may have the same signal.

Therefore, when odd word lines and even word lines are alternatively activated, or every Nth word line is activated during the wafer burn-in test, a normal cell right next to the dummy word lines, which are biased to a constant level, is not stressed enough.

Causes of early stage product failure may exist on defects in the gate oxide of a cell as well as in oxide between the cells. To detect such defects between cells, a bit line and the adjacent bit line are to have different voltages from each other. Therefore, upper and lower bit line sense and amplification units (BLSA) are provided with bit line precharge voltages, which are different from each other, in response to a bit line equalization signal. However, the dummy word lines cannot be individually controlled because the biases of the dummy word lines are combined and all the dummy word lines may have the same signal.

Therefore, when the bit line precharge voltages are alternatively activated, an equalized stress may not be applied to the normal cells and the dummy cells and early stage product failure may not be detected. Reliability of the semiconductor product is greatly affected by the wafer burn-in test for detecting early stage product failure.

SUMMARY

Various embodiments of the present invention are directed to a method of wafer burn-in test capable of stressing out the normal cells and the dummy cells equally and a semiconductor memory device for the same.

In accordance with an exemplary embodiment of the present invention, a semiconductor memory device may include a memory cell array with a plurality of word lines, first and second dummy word lines, and a dummy word line driver suitable for driving the first and second dummy word lines separately for a wafer burn-in test where the word lines are driven by group.

In accordance with another exemplary embodiment of the present invention, a semiconductor memory device may include a memory cell array with a plurality of bit lines and one or more dummy bit lines adjacent to outermost bit lines of the plurality of bit lines, and a dummy bit line driving unit suitable for electrically coupling each of the dummy bit lines to a bit line adjacent to an outermost bit line, for a wafer burn-in test.

In accordance with a further exemplary embodiment of the present invention, a method of a wafer burn-in test for a semiconductor memory device, the method may include grouping a plurality of word lines and applying a stress bias to groups of the word lines sequentially, and applying a first stress bias to a first dummy word line adjacent to a uppermost word line of the plurality of word lines, wherein the first stress bias has a complementary level to a stress bias of the uppermost word line.

In accordance with the embodiments of the present invention, the semiconductor memory device may perform a wafer burn-in test capable of stressing out the normal cells and the dummy cells equally, thereby effectively preventing early stage product failure and increasing the reliability of the semiconductor memory device.

DETAILED DESCRIPTION

Figure 1:
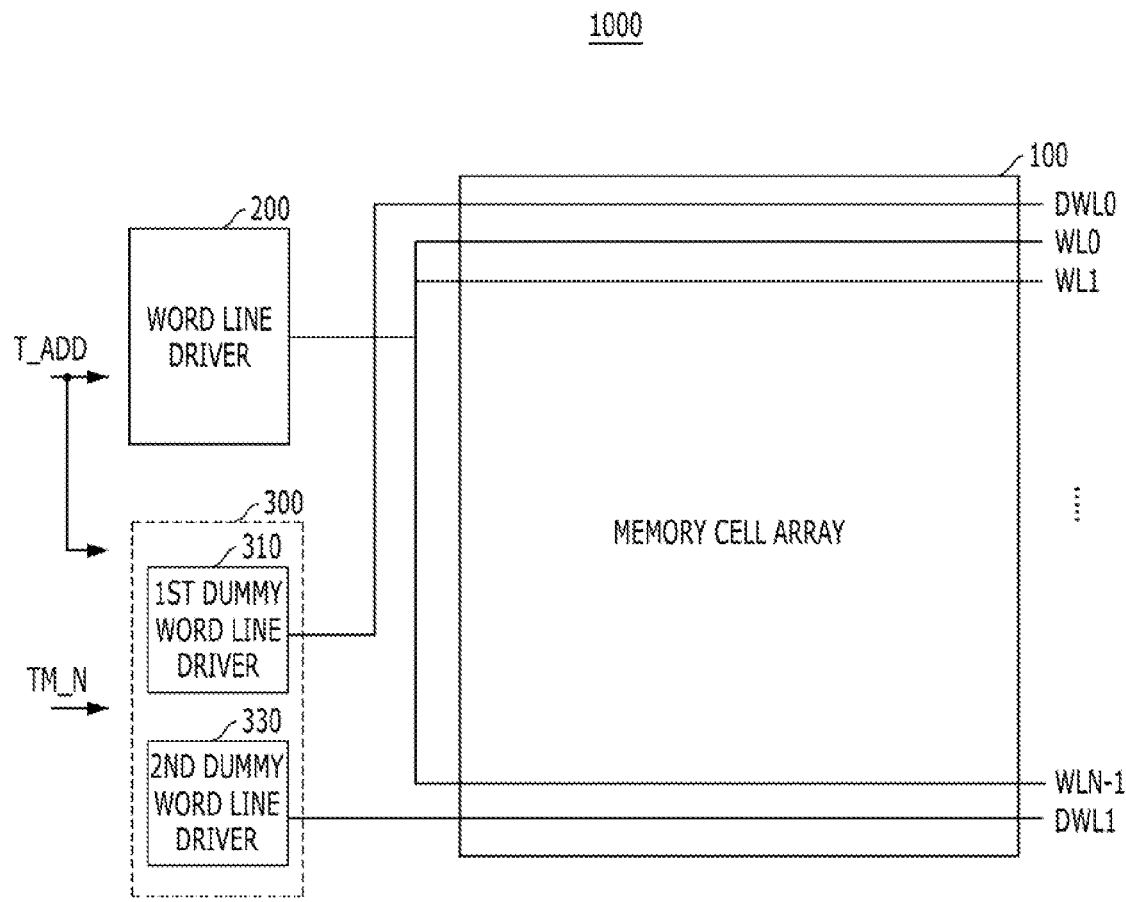
FIG. 1 is a block diagram illustrating a semiconductor memory device in accordance with an exemplary embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the scope of the present invention to those skilled in the art. The drawings are not necessarily to scale and in some instances, proportions may have been exaggerated in order to clearly illustrate features of the embodiments. Throughout the disclosure, reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers to a case where the first layer is formed directly on the second layer or the substrate but also a case where a third layer exists between the first layer and the second layer or the substrate.

In the description, a test mode may refer to the wafer burn-in test mode.

During the wafer burn-in test, oxide between a gate and a channel of a transistor and between two electrodes of a cell capacitor is stressed out. The transistor controls charging and discharging of the cell capacitor. To apply stress to the oxide between the gate and the channel of the transistor, high voltage is applied to a word line. To apply stress to the oxide between the two electrodes of the cell capacitor, high voltage is applied to a bit line for providing charge to the cell when the word line is activated. Therefore, in accordance with exemplary embodiments of the present invention, a dummy word line and a dummy bit line is controlled in order to apply stress bias equally to a normal cell and a dummy cell in a memory cell array.

FIG. 1 is a block diagram illustrating a semiconductor memory device in accordance with an exemplary embodiment of the present invention.

The semiconductor memory device may control a dummy word line during the wafer burn-in test.

Referring to FIG. 1, the semiconductor memory device 1000 may include a memory cell array 100, a word line driver 200 and a dummy word line driver 300. The dummy word line driver 300 may include a first dummy word line driver 310 and a second dummy word line driver 330.

The memory cell array 100 may include a plurality of word lines WL<0:N−1>, a first dummy word line DWL0 disposed adjacent to the uppermost word line WL0 of the plurality of word lines WL<0:N−1> and a second dummy word line DWL1 disposed adjacent to the lowermost word line WLN−1 of the plurality of word lines WL<0:N−1>.

The word line driver 200 may operate in order to selectively activate the plurality of word lines WL<0:N−1> for the wafer burn-in test. In other words, the word line driver 200 may operate in order to activate a word line corresponding to a test address T_ADD in the test mode. The word line driver 200 may drive the plurality of word lines WL<0:N−1> by group in the wafer burn-in test.

The word line driver 200 in the normal mode may decode an address input signal A<0 :N−1> of N bits to selectively access the 2^N word lines. For example, the word line driver 200 in the normal mode may decode the address input signal A<0:9> of 10 bits to selectively access the 1024 word lines.

The following tables are provided for understanding the address decoding operation to activate the word lines. The word line driver 200 may be embodied in various structures to activate word lines by modifying a circuit design.

Referring to TABLE 1, the address input signal A<0:9> of 10 bits may be combined to activate the 1024 word lines WL<0:1023>.

TABLE 1

| | WL0 | WL1 | WL2 | WL3 | WL4 | WL5 | WL6 | WL7 | WL8 | ... | WL1022 | WL1023 |
|---|---|---|---|---|---|---|---|---|---|---|---|---|
| A0 | A0B | A0D | A0B | A0D | A0B | A0D | A0B | A0D | A0B | ... | A0B | A0D |
| A1 | A1B | A1B | A1D | A1D | A1B | A1B | A1D | A1D | A1B | ... | A1D | A1D |
| A2 | A2B | A2B | A2B | A2B | A2D | A2D | A2D | A2D | A2B | ... | A2D | A2D |
| A3 | A3B | A3B | A3B | A3B | A3B | A3B | A3B | A3B | A3D | ... | A3D | A3D |
| . | . | . | . | . | . | . | . | . | . | | . | . |
| . | . | . | . | . | . | . | . | . | . | | . | . |
| . | . | . | . | . | . | . | . | . | . | | . | . |
| A9 | A9B | A9B | A9B | A9B | A9B | A9B | A9B | A9B | A9B | ... | A9D | A9D |

Referring to TABLE 1, a word line may be activated based on a level of each bit of the address input signal A<0:9>.

The decoding is performed in several steps because a logic gate, which receives a lot of input signals, does not operate well and a lot of lines are required to transfer all of the address signals to every memory cell array. The word line WL may be provided with a ground voltage VSS in a standby mode and with a pumping voltage VPP or a negative word line voltage VBBW in the normal mode. Therefore, the first and second dummy word lines DWL0 and DWL1 may be of the negative word line voltage VBBW or the pumping voltage VPP. The negative word line voltage VBBW is lower than the ground voltage VSS and used for a negative word line driving scheme. According to the negative word line driving scheme, the pumping voltage VPP is provided for activation of the word line and the negative word line voltage VBBW is provided for deactivation of the word line. For deactivation of the word line, the word line is provided with the negative word line voltage VBBW according to the negative word line driving scheme, while the word line is provided with the ground voltage VSS, according to ordinary word line driving scheme.

In the test mode, the word line driver 200 may fix part of N bits of the address input signal A<0:N> to a high voltage level depending on the number of word lines to be activated simultaneously among the plurality of word lines WL<0:N−1>.

For example, the word line driver 200 may fix the voltage level of nine bits A<1:9> of the address input signal A<0:9>, except for the first bit A<0>, to the high level when the word line driver 200 is to activate a half of the 1024 word lines WL<0:1023> simultaneously.

may be activated depending on whether the least significant bit address A0 of the test address T_ADD is A0D or A0B. For example, the least significant bit address A0 is activated and deactivated between high and low levels A0D and A0B. In case that half of the 1024 word lines WL<0:1023> are to be activated simultaneously, the word lines WL1, WL3, . . . , WL1023 corresponding to the level A0D may be activated simultaneously when the least significant bit address A0 of the test address T_ADD is applied as the high level A0D. Also, the word lines WL0, WL2, . . . , WL1022 corresponding to the level A0B may be activated simultaneously when the least significant bit address A0 of the test address T_ADD is applied as the low level A0B.

For another example, the word line driver 200 may fix the voltage level of eight bits A<2:9> of the address input signal A<0:9>, except for the first and second bits A<0:1>, to the high level when the word line driver 200 is to activate a quarter of the 1024 word lines WL<0:1023> simultaneously.

TABLE 3

|    | WL0 | WL1 | WL2 | WL3 | WL4 | WL5 | WL6 | WL7 | WL8 | ... | WL1022 | WL1023 |
|----|-----|-----|-----|-----|-----|-----|-----|-----|-----|-----|--------|--------|
| A0 | A0B | A0D | A0B | A0D | A0B | A0D | A0B | A0D | A0B | ... | A0B    | A0D    |
| A1 | A1B | A1B | A1B | A1B | A1D | A1D | A1D | A1D | A1B | ... | A1D    | A1D    |
| A2 |     |     |     |     |     |     |     | Fix_High |  |     |        |        |
| A3 |     |     |     |     |     |     |     | Fix_High |  |     |        |        |
| .  |     |     |     |     |     |     |     |     |     |     |        |        |
| .  |     |     |     |     |     |     |     |     |     |     |        |        |
| .  |     |     |     |     |     |     |     |     |     |     |        |        |
| A9 |     |     |     |     |     |     |     | Fix_High |  |     |        |        |

Referring to TABLE 3, eight bits A<2:9> of the address input signal A<0:9>, except for the least significant bit addresses A0 and A1, are fixed to the high level and thus a word line may be activated depending on combinations of the least significant bit addresses A0 and A1 of the test address T_ADD. In case that a quarter of the 1024 word lines WL<0:1023> are to be activated simultaneously, the word lines WL0, WL4, WL8, . . . , WL1020 corresponding to the combination of the levels A0B and A1B of the least significant bit addresses A0 and A1 may be activated simultaneously when the least significant bit addresses A0 and A1 of the test address T_ADD are applied as the low levels A0B and A1B.

As another example, the word line driver 200 may fix the voltage level of seven bits A<3:9> of the address input signal

TABLE 2

|    | WL0 | WL1 | WL2 | WL3 | WL4 | WL5 | WL6 | WL7 | WL8 | ... | WL1022 | WL1023 |
|----|-----|-----|-----|-----|-----|-----|-----|-----|-----|-----|--------|--------|
| A0 | A0B | A0D | A0B | A0D | A0B | A0D | A0B | A0D | A0B | ... | A0B    | A0D    |
| A1 |     |     |     |     |     |     | Fix_High |  |     |     |        |        |
| A2 |     |     |     |     |     |     | Fix_High |  |     |     |        |        |
| A3 |     |     |     |     |     |     | Fix_High |  |     |     |        |        |
| .  |     |     |     |     |     |     |     |     |     |     |        |        |
| .  |     |     |     |     |     |     |     |     |     |     |        |        |
| .  |     |     |     |     |     |     |     |     |     |     |        |        |
| A9 |     |     |     |     |     |     | Fix_High |  |     |     |        |        |

Referring to TABLE 2, nine bits A<1:9> of the address input signal A<0:9>, except for the least significant bit address A0, are fixed to the high level and thus a word line A<0:9>, except for the first to third bits A<0:2>, to the high level when the word line driver 200 is to activate one-eighth of the 1024 word lines WL<0:1023> simultaneously.

TABLE 4

| | WL0 | WL1 | WL2 | WL3 | WL4 | WL5 | WL6 | WL7 | WL8 | ... | WL1022 | WL1023 |
|---|---|---|---|---|---|---|---|---|---|---|---|---|
| A0 | A0B | A0D | A0B | A0D | A0B | A0D | A0B | A0D | A0B | ... | A0B | A0D |
| A1 | A1B | A1B | A1D | A1D | A1B | A1B | A1D | A1D | A1B | ... | A1D | A1D |
| A2 | A2B | A2B | A2B | A2B | A2D | A2D | A2D | A2D | A2B | ... | A2D | A2D |
| A3 | | | | | | | Fix_High | | | | | |
| . | | | | | | | . | | | | | |
| . | | | | | | | . | | | | | |
| . | | | | | | | . | | | | | |
| A9 | | | | | | | Fix_High | | | | | |

Referring to TABLE 4, seven bits A<3:9> of the address input signal A<0:9>, except for the least significant bit addresses A0 to A2, are fixed to the high level and thus a word line may be activated depending on combinations of the least significant bit addresses A0 to A2 of the test address T_ADD. In case that one-eighth of the 1024 word lines WL<0:1023> are to be activated simultaneously, the word lines WL0, WL8, WL16, ..., WL1016 corresponding to the combination of the levels A0B, A1B and A2B of the least significant bit addresses A0 to A2 may be activated simultaneously when the least significant bit addresses A0 to A2 of the test address T_ADD are applied as the low levels A0B, A1B, and A2B.

Although the 1024 word lines WL<0:1023> may be divided into more than eight groups, it may be meaningless in consideration of the short amount of time for the wafer burn-in test.

In case that a half of the 1024 word lines WL<0:1023> are to be activated simultaneously, odd word lines WL1, WL3, ..., WL1023 or even word lines WL0, WL2, ..., WL1022 may be simultaneously activated in response to the least significant bit address A0. In case that a quarter of the 1024 word lines WL<0:1023> are to be activated simultaneously, corresponding word lines may be simultaneously activated in response to the least significant bit addresses A0 and A1. In case that one-eighth of the 1024 word lines WL<0:1023> are to be activated simultaneously, corresponding word lines may be simultaneously activated in response to the least significant bit addresses A0 to A2. The test address T_ADD for controlling the plurality of word lines WL<0:N−1> for the wafer burn-in test may be the least significant bit address A0 in case that a half of the 1024 word lines WL<0:1023> are to be activated simultaneously, the least significant bit addresses A0 and A1 in case that a quarter of the 1024 word lines WL<0:1023> are to be activated simultaneously, and the least significant bit addresses A0 to A2 in case that one-eighth of the 1024 word lines WL<0:1023> are to be activated simultaneously.

In accordance with exemplary embodiments of the present invention, the first and second dummy word lines DWL0 and DWL1 may be controlled in order to be activated together with word lines simultaneously selected in the test mode.

The dummy word line driver 300 of the semiconductor memory device 1000 may separately drive the first dummy word line DWL0 and the second dummy word line DWL1.

The first dummy word line driver 310 may operate to activate the first dummy word line DWL0 based on a first control address (not shown) in response to a test mode selection signal TM_N. The second dummy word line driver 330 may activate the second dummy word line DWL1 based on a second control address (not shown) in response to the test mode selection signal TM_N. The first control address may activate the lowermost word line WLN−1 and the second control address may activate the uppermost word line WL0.

Referring to TABLE 4 illustrating the 1024 word lines, the first control address may correspond to the signals A0D, A1D and A2D and the second control address may correspond to the signals A0B, A1B and A2B, which means that the first control address and the second control address may have values complementary to each other. The first and second control addresses may be changed depending on a total number of word lines because a number of addresses change depending on the total number of word lines.

As described above, the first dummy word line DWL0 and the second dummy word line DWL1 may be activated based on the first control address and the second control address and thus the first dummy word line DWL0 may have an address whose value is complementary to that of the uppermost word line WL0 and the second dummy word line DWL1 may have an address whose value is complementary to that of the value of the lowermost word line WLN−1. In other words, each of the dummy word lines may have an address whose value is complementary to that of the outermost word line adjacent thereto, which means that the first dummy word line DWL0 and the second dummy word line DWL1 are provided with stress biases complementary to each other while the word lines with the addresses of the same value are activated simultaneously and provided with the same stress bias in the test mode.

The stress bias in the wafer burn-in test of the word lines may be applied to the word line and the dummy word line that are activated with a voltage level higher than the pumping voltage VPP of the normal mode. The pumping voltage VPP may be higher than the high voltage VDD in order to turn on a NMOS transistor coupled to a word line at its gate by applying a voltage higher than the high voltage VDD plus a threshold voltage VTH thereto.

The test mode selection signal TM_N may include a command for selecting a number of word lines to be activated simultaneously in the test mode. As described above, part of the total word lines may be activated simultaneously in order to perform the wafer burn-in test as fast as possible. The wafer burn-in test mode may include a half test mode TM_2 for simultaneous activation of the half of the 1024 word lines WL<0:1023>, a quarter test mode TM_4 for simultaneous activation of the quarter of the 1024 word lines WL<0:1023>, and a one-eighth test mode TM_8 for simultaneous activation of one-eighth of the 1024 word lines WL<0:1023>.

Operation of the semiconductor memory device 1000 in accordance with an exemplary embodiment of the present invention will be described.

It is described as an example that the plurality of word lines WL<0:N−1> in the memory cell array 100 includes the first word line WL0 and the last word line WLN−1. As described above, the first dummy word line DWL0, adjacent to the first word line WL0, may have an address with a level opposite to that of the first word line WL0, and the second dummy word line DWL1, adjacent to the last word line WLN−1, may have an address with a level opposite to that of the last word line WLN−1.

When the test mode selection signal for the half test mode TM_2 for simultaneous activation of half of the plurality of word lines WL<0:N−1> is applied to the semiconductor memory device 1000, all bits A<1:N−1> of the address input signals A<0 :N−1>, except for the least significant bit address A0, are fixed to the high level and thus a word line may be activated depending on whether the least significant bit address A0 of the test address T_ADD is A0D or A0B. The odd word lines WL1, WL3, . . . , WLN−1 corresponding to level A0D may be activated simultaneously when the least significant bit address A0 of the test address T_ADD is applied as the high level A0D. Also, the even word lines WL0, WL2, . . . , WLN−2 corresponding to level A0B may be activated simultaneously when the least significant bit address A0 of the test address T_ADD is applied as the low level A0B.

Also, when the test mode selection signal for the half test mode TM_2 is applied to the dummy word line driver 300, the first dummy word line DWL0 may be controlled by the level A0D of the least significant bit address A0 (i.e., the first control addresses), and the second dummy word line DWL1 may be controlled by the level A0B of the least significant bit address A0 (i.e., the second control addresses). Therefore, the first dummy word line DWL0 may have the same address as the odd word lines WL1, WL3, WL5, . . . , WLN−1 and the second dummy word line DWL1 may have the same address as the even word lines WL0, WL2, WL4, . . . , WLN−2.

Therefore, the first dummy word line DWL0 together with the odd word lines WL1, WL3, WL5, . . . , WLN−1 or the second dummy word line DWL1 together with the even word lines WL0, WL2, WL4, . . . , WLN−2 may be activated depending on whether the least significant bit address A0 of the test address T_ADD is A0D or A0B. When a bias is applied to the activated word lines and the activated dummy word line, all of cells in the memory cell array may be equally stressed out because the dummy word lines are separately driven.

When the test mode signal is enabled in a wafer burn-in test, the semiconductor memory device enters the test mode and all of the internal voltage generators are halted and the preferred level stress bias is applied from an external source pad to the semiconductor memory device.

Operation for controlling the dummy word lines will be described with reference to FIG. 2.

Figure 2:
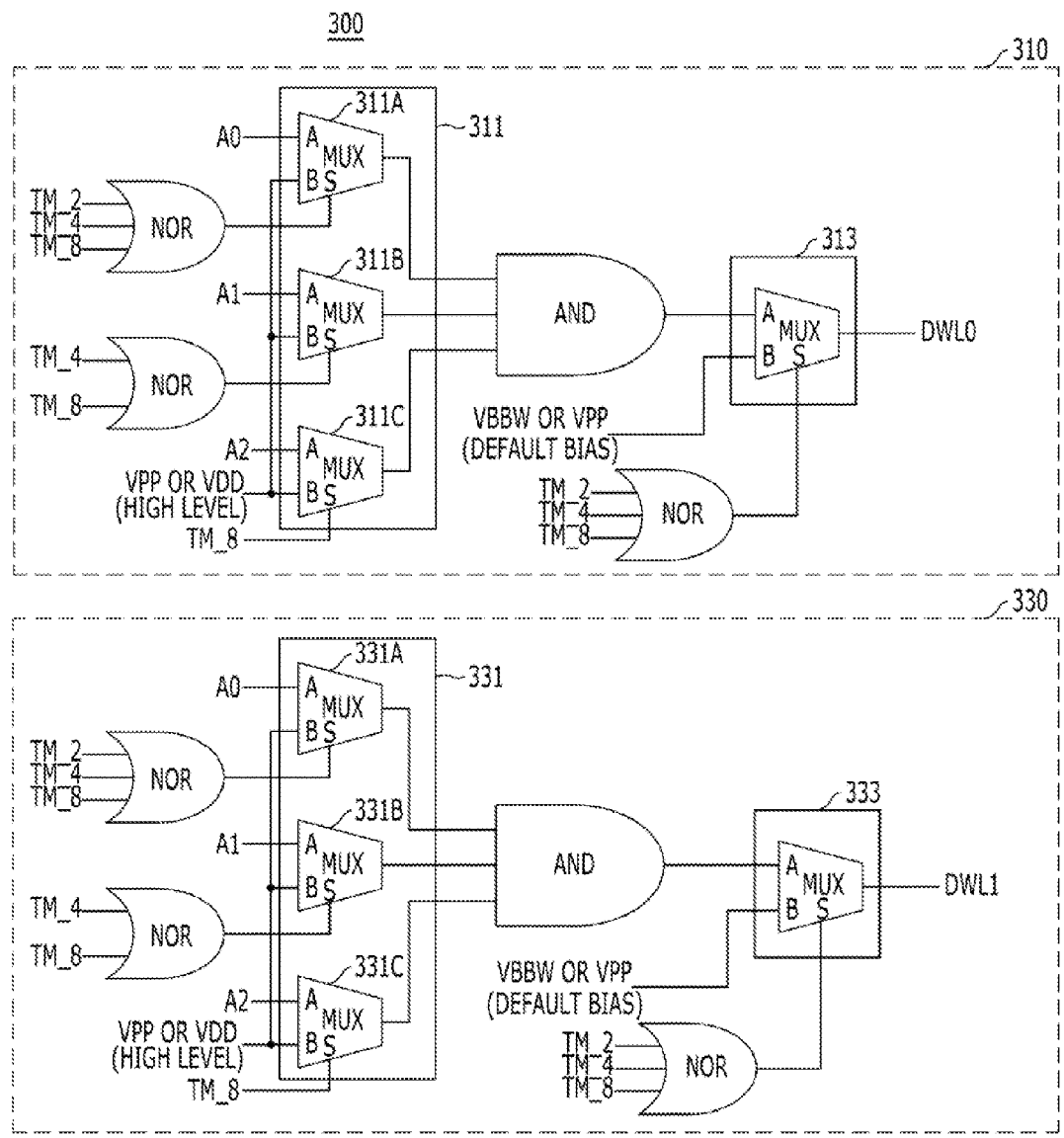
FIG. 2 is a circuit diagram illustrating a dummy word line driver shown in FIG. 1.

FIG. 2 is a circuit diagram illustrating the dummy word line driver 300 shown in FIG. 1.

Referring to FIG. 2, the dummy word line driver 300 may include the first dummy word line driver 310 and the second dummy word line driver 330.

Both the first dummy word line driver 310 and the second dummy word line driver 330 may include three NOR gates, a first selection unit 311 and 331, a second selection unit 313 and 333, and an AND gate. The first selection unit 311 and 331 may include three multiplexers MUXs, each of which may be coupled to the AND gate. The dummy word line driver 300 may be implemented in various ways for controlling the dummy word lines and the number of multiplexers MUXs in the first selection unit 311 and 331 may be changed by modifying a circuit design.

The multiplexer MUX in the first selection unit 311 and 331 may have two input terminals A and B, a control terminal S, and an output terminal Q.

The first control addresses A0, A1 , and A2 are respectively inputted to the first input terminals A of the three multiplexers 311A, 311B and 311C in the first selection unit 311. The pumping voltage VPP or the power voltage VDD is inputted to the second input terminals B of the three multiplexers 311A, 311B and 311C. As described above, the first dummy word line DWL0 is activated when the first control addresses A0, A1 and A2 have the same levels A0D, A1D, and A2D as the address for activation of the lowermost word line WLN−1 of the memory cell array 100.

The three multiplexers 311A, 311B and 311C may transfer a value of the first input terminal A to the output terminal Q when a signal inputted to the control terminal S is enabled and may transfer a value of the second input terminal B to the output terminal Q when the signal inputted to the control terminal S is disabled. A test mode selection signal TM_8 or an output of a NOR gate, which receives test mode selection signals TM_2, TM_4 or TM_8 as input signals, is provided through the control terminal S. The outputs of the three multiplexers MUXs may be determined depending on the values at the control terminals S.

The outputs of the three multiplexers MUXs may be inputted to the AND gate and an output of the AND gate may be inputted to a first input terminal A of the second selection unit 313.

A second input terminal B of the second selection unit 313 may be provided with a default bias, that is, the negative word line voltage VBBW or the pumping voltage VPP. Through the control terminal S of the second selection unit 313 an output of the NOR gate, which receives the test mode selection signals TM_2, TM_4 and TM_8 as input signals, is provided. Therefore, when one of the test mode selection signals TM_2, TM_4 and TM_8 is enabled and the enabled test mode selection signal is provided to the control terminal S of the second selection unit 313, an output signal of the AND gate is provided to the first dummy word line DWL0. When the test mode selection signals TM_2, TM_4 and TM_8 are disabled, the second selection unit 313 may provide the default bias VBBW or VPP to the first dummy word line DWL0.

When the test mode selection signal for the half test mode TM_2 is applied with the high level, the outputs of the three multiplexers MUXs are 'A0', 'H' and 'H'. And when the test address T_ADD (A0) is enabled as the high level A0D, the output signal of the AND gate may be of the high level and the first dummy word line DWL0 may be activated.

The second control addresses A0, A1, and A2 are respectively inputted to first input terminals A of the three multiplexers 331A, 331B and 331C in the first selection unit 331. The high level of the pumping voltage VPP or the power voltage VDD is inputted to second input terminals B of the three multiplexers 331A, 331B and 331C. As described above, the second dummy word line DWL1 is activated when the second control addresses A0, A1 and A2 have the same levels A0B, A1B, and A2B as the address for activation of the uppermost word line WL0 of the memory cell array 100.

The three multiplexers 331A, 331B and 331C may transfer a value of the first input terminal A to the output terminal Q when a signal inputted to the control terminal S is enabled and may transfer a value of the second input terminal B to the output terminal Q when the signal Inputted to the control terminal S is disabled. A test mode selection signal TM_8 or an output of a NOR gate, which receives test mode selection signals TM_2, TM_4 or TM_8 as input signals, is provided through the control terminal S. The outputs of the three multiplexers MUXs may be determined depending on the values at the control terminals S.

The outputs of the three multiplexers MUXs may be inputted to the AND gate and an output of the AND gate may be inputted to a first input terminal A of the second selection unit 333.

A second input terminal B of the second selection unit 333 may be provided with a default bias, that is, the negative word line voltage VBBW or the pumping voltage VPP. Through the control terminal S of the second selection unit 333, an output of the NOR gate, which receives the test mode selection signals TM_2, TM_4 and TM_8 as input signals, is provided. Therefore, when one of the test mode selection signals TM_2, TM_4 and TM_8 is enabled and the enabled test mode selection signal is provided to the control terminal S of the second selection unit 333, an output signal of the AND gate is provided to the second dummy word line DWL1. When the test mode selection signals TM_2, TM_4 and TM_8 are disabled, the second selection unit 333 may provide the default bias VBBW or VPP to the second dummy word line DWL1.

When the test mode selection signal for the half test mode TM_2 is applied with the high level, the outputs of the three multiplexers MUXs are 'A0', 'H' and 'H'. And when the test address T_ADD (A0) is enabled as the low level A0B, the output signal of the AND gate may be of the high level and the second dummy word line DWL1 may be activated.

Operation of the dummy word line driver 300 will be described.

In case that half of total word lines WL<0:N−1> are to be activated simultaneously, the test mode selection signal for the half test mode TM_2 for simultaneous activation of half of the plurality of word lines WL<0:N−1> may be applied with the high level. When the test mode selection signal for the half test mode TM_2 for simultaneous activation of half of the plurality of word lines WL<0:N−1> may be applied with the high level to the first dummy word line driver 310 and the second dummy word line driver 330, the signal A0 may be outputted through the output terminal Q of the first multiplexer 311A of the first dummy word line driver 310. Signals inputted through the control terminals S of the second multiplexer 311B and the third multiplexer 311C may be disabled and the high level of the pumping voltage VPP or the power voltage VDD is outputted through the output terminals Q of the second multiplexer 311B and the third multiplexer 311C. Also, the signal A0 may be outputted through the output terminal Q of the first multiplexer 331A of the second dummy word line driver 330. Signals inputted through the control terminals S of the second multiplexer 331B and the third multiplexer 331C may be disabled and the high level of the pumping voltage VPP or the power voltage VDD is outputted through the output terminals Q of the second multiplexer 331B and the third multiplexer 331C.

Therefore, when the test mode selection signal for the half test mode TM_2 is applied, the first dummy word line DWL0 and the second dummy word line DWL1 may be activated based on one address A0 among test addresses A0, A1 and A2.

And then, when the one address A0 of the test addresses A0, A1 and A2 is applied with the high level A0D to the semiconductor memory device 1000, the first dummy word line DWL0 together with the odd word lines WL1, WL3, WL5, . . . , WL1023, which correspond to the address information A0D, may be activated simultaneously. Then, the wafer burn-in test may be performed by applying the stress bias to the activated word lines and the activated first dummy word line DWL0.

Next, when the one address A0 of the test addresses A0, A1 and A2 is applied with the low level A0B to the semiconductor memory device 1000, the second dummy word line DWL1 together with the even word lines WL0, WL2, WL4, . . . , WL1022, which correspond to the address information A0B, may be activated simultaneously. The wafer burn-in test may then be performed by applying the stress bias to the activated word lines and the activated second dummy word line DWL1.

In case that half of the word lines WL<0:N−1> are to be activated simultaneously, odd word lines or even word lines may be simultaneously activated, the dummy word line may be activated together with the odd or even word lines and provided with the same bias and thus the normal cells and the dummy cells in the memory cell array may be equally stressed out.

When the test mode selection signal for the quarter test mode TM_4 for simultaneous activation of a quarter of the plurality of word lines WL<0:N−1> is applied to the semiconductor memory device 1000, the first multiplexer 311A and the second multiplexer 311B of the first dummy word line driver 310 may output the addresses A0 and A1 and the third multiplexer 311C may be fixed to the high level of the pumping voltage VPP or the power voltage VDD. The first multiplexer 331A and the second multiplexer 331B of the second dummy word line driver 330 may output the addresses A0 and A1 and the third multiplexer 331C may be fixed to the high level of the pumping voltage VPP or the power voltage VDD.

Therefore, when the test mode selection signal for the quarter test mode TM_4 is applied, the first dummy word line DWL0 and the second dummy word line DWL1 may be activated based on the addresses A0 and A1 among the test addresses A0, A1 and A2.

And then, when the levels A0D and A1D of the test addresses A0 and A1 are applied to the semiconductor memory device 1000, the first dummy word line DWL0 may be activated and the second dummy word line DWL1 may be deactivated.

When the test mode selection signal for the one-eighth test mode TM_8 for simultaneous activation of one-eighth of the plurality of word lines WL<0:N−1> is applied to the semiconductor memory device 1000, the first multiplexer 311A, the second multiplexer 311B and the third multiplexer 311C of the first dummy word line driver 310 may output the addresses A0, A1 and A2. The first multiplexer 331A, the second multiplexer 331B and the third multiplexer 331C of the second dummy word line driver 330 may output the addresses A0, A1 and A2.

Therefore, when the test mode selection signal for the one-eighth test mode TM_8 is applied, the first dummy word line DWL0 and the second dummy word line DWL1 may be activated based on the test addresses A0, A1 and A2.

And then, when the levels A0D, A1D and A2D of the test addresses A0, A1 and A2 are applied to the semiconductor memory device 1000, the first dummy word line DWL0 together with the corresponding word lines may be activated and the second dummy word line DWL1 may be deactivated.

The first dummy word line DWL0 and the second dummy word line DWL1 may have values opposite to the outermost word lines, WL0 and WLN−1, respectively. Therefore, the dummy word line and a word line adjacent thereto may not be activated simultaneously.

In accordance with the embodiment of the present invention, during the wafer burn-in test, a number of word lines to be activated simultaneously may be determined in response to the test mode selection signals TM_2, TM_4 and TM_8 and a part of the addresses may be fixed to the high level. Therefore, a half, a quarter or one-eighth of the plurality of word lines WL<0:N−1> may be activated simultaneously in response to the test mode selection signals TM_2, TM_4 and TM_8. The test mode selection signals TM_2, TM_4 and TM_8, which correspond to the number of word lines to be activated simultaneously may also be inputted to the dummy word line driver 300.

The dummy word line driver 300 may control the first dummy word line DWL0 or the second dummy word line DWL1 in response to the test mode selection signals TM_2, TM_4 and TM_8. The dummy word line may also be selected and activated together with the word lines simultaneously. The wafer burn-in test may be performed by applying the stress bias to the activated word lines and the activated dummy word line. As described above, the stress bias may be applied to the word line and the dummy word line that are activated with a voltage level higher than the pumping voltage VPP of the normal mode.

Therefore, the normal cells and the dummy cells in the memory cell array may be equally stressed out and the wafer burn-in test for detecting early stage product failure may be performed more effectively.

Figure 3:
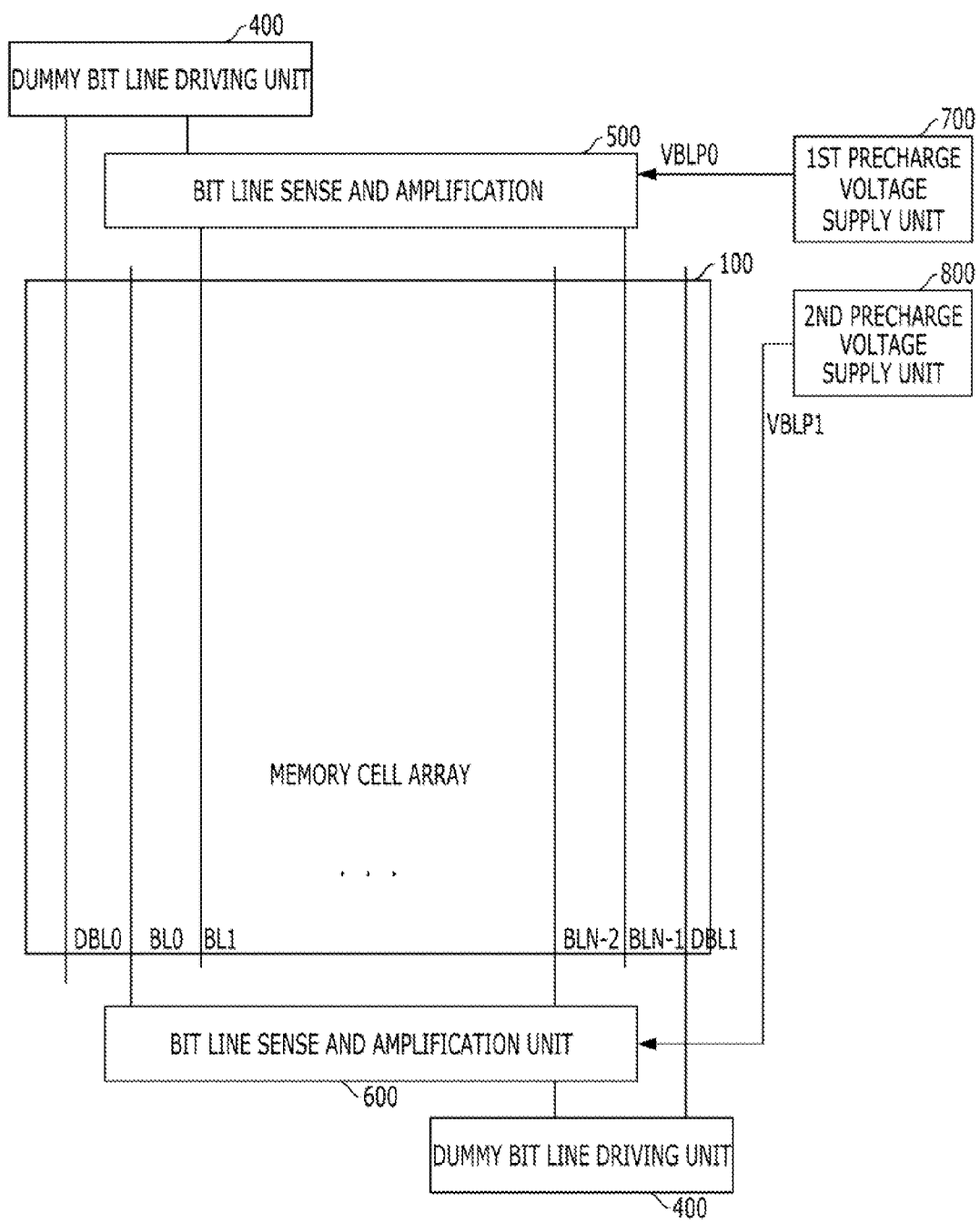
FIG. 3 is a block diagram illustrating a semiconductor memory device in accordance with an exemplary embodiment of the present invention.

FIG. 3 is a block diagram illustrating a semiconductor memory device in accordance with a second exemplary embodiment of the present invention.

The semiconductor memory device may control a dummy bit line during the wafer burn-in test.

Referring to FIG. 3, the semiconductor memory device 1000 may include a memory cell array 100, a dummy bit line driving unit 400, bit line sense and amplification units 500 and 600, a first precharge voltage supply unit 700 and a second precharge voltage supply unit 800.

The memory cell array 100 may include a plurality of bit lines BL<0:N−1> and one or more dummy bit lines DBL0 and DBL1 disposed at the border of the memory cell array 100 and adjacent to the outermost bit lines BL0 and BLN−1. The plurality of bit lines BL<0:N−1> may include a bit line coupled to redundancy cells for replacing a defective cell and a bit line coupled to cells for error correction code (ECC) operation as well as a bit line coupled to normal cells, which are actually involved with data write and read operation.

The dummy bit line driving unit 400 may electrically couple the dummy bit line DBL0 to a bit line BL1 adjacent to the outermost bit line BL0 for the wafer burn-in test. Also, the dummy bit line driving unit 400 may electrically couple the other dummy bit line DBL1 to a bit line BLN−2 adjacent to the other outermost bit line BLN−1. A detailed description for the dummy bit line driving unit 400 will be set forth with reference to FIG. 4.

In the description, a dummy bit line disposed at one side, for example, the left side of the memory cell array 100, is referred to as a first dummy bit line DBL0 and a dummy bit line disposed at the other side, for example, the right side of the memory cell array 100, is referred to as a second dummy bit line DBL1.

The upper bit line sense and amplification unit 500 disposed at one side, for example, the upper side of the memory cell array 100, and the lower bit line sense and amplification unit 600 disposed at the other side, for example, the lower side of the memory cell array 100, may sense and amplify data stored in a plurality of cells (not shown).

The plurality of bit lines BL<0:N−1> may include odd bit lines BL1, BL3, BL5, . . . , BLN−1 and even bit lines BL0, BL2, BL4, . . . , BLN−2. The upper bit line sense and amplification unit 500 may be coupled to the odd bit lines BL1, BL3, BL5, . . . , BLN−1 and the lower bit line sense and amplification unit 600 may be coupled to the even bit lines BL0, BL2, BL4, . . . , BLN−2. The connection relation between the bit line sense and amplification units 500 and 600 and the plurality of bit lines BL<0:N−1> may be changed by modifying the circuit design.

The bit line sense and amplification units 500 and 600 may be coupled to the plurality of bit lines BL<0:N−1> and sense and amplify data stored in a plurality of cells in the memory cell array 100. The plurality of bit lines BL<0:N−1> may be provided with a core voltage VCORE or the ground voltage VSS in the normal mode and with a bit line precharge voltage VBLP in the standby mode. The core voltage VCORE may be used to drive the bit line sense and amplification units 500 and 600 and to store a data with the high level in a memory cell. The precharge voltage VBLP may be generated from the core voltage VCORE and have a half level of the core voltage VCORE.

The odd bit lines BL1, BL3, BL5, . . . , BLN−1 may be provided with a first precharge voltage VBLP0 and the even bit lines BL0, BL2, BL4, . . . , BLN−2 may be provided with a second precharge voltage VBLP1, in response to the bit line equalization signal (not shown) in the standby mode. Therefore, a pair of bit lines of the plurality of bit lines BL<0:N−1>, which are adjacent to each other, may be provided with precharge voltages VBLP with different voltage levels from each other. The first and second precharge voltages VBLP0 and VBLP1, which are respectively provided to the odd bit lines BL1, BL3, BL5, . . . , BLN−1 and the even bit lines BL0, BL2, BL4, . . . , BLN−2, may be changed by modifying a circuit design, which means that a pair of bit lines of the plurality of bit lines BL<0:N−1>, which are adjacent to each other, may be provided with precharge voltages VBLP with complementary voltage levels to each other.

Therefore, during activation of word lines (not shown) in the wafer burn-in test, the dummy bit line driving unit 400 may couple the first dummy bit line DBL0 to the odd bit lines BL1, BL3, BL5, . . . , BLN−1 and the second dummy bit line DBL1 to the even bit lines BL0, BL2, BL4, . . . , BLN−2. For example, the first dummy bit line DBL0 is coupled to the first bit line BL1 and the second dummy bit line DBL1 is coupled to the (N−2)th bit line BLN−2 and thus an equal stress may be provided to the normal cells and the dummy cells when the first precharge voltage VBLP0 and the second precharge voltage VBLP1 are alternatively provided. During activation of word lines, all of the word lines may be activated or part of the word lines may be activated, which means that the bit lines and the word lines may be activated in combination.

Figure 4:
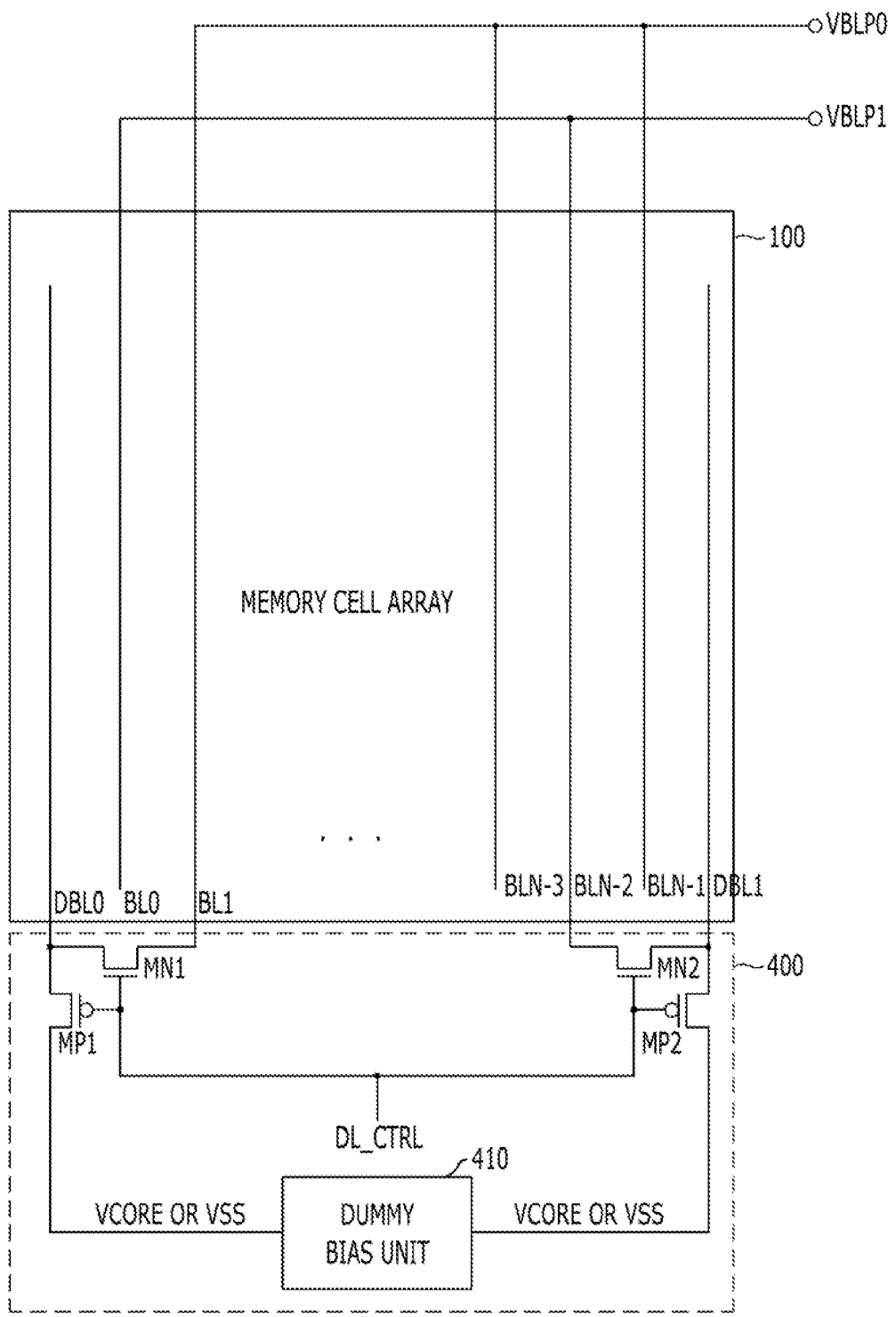
FIG. 4 is a circuit diagram illustrating the dummy bit line driving unit shown in FIG. 3.

FIG. 4 is a circuit diagram illustrating the dummy bit line driving unit 400 shown in FIG. 3.

Referring to FIG. 4, the memory cell array 100 may include the plurality of bit lines BL<0:N−1>, the first dummy bit line DBL0 adjacent to the one BL0 of the outermost bit lines BL0 and BLN−1 in the plurality of bit lines BL<0:N−1> and the second dummy bit line DBL1 adjacent to the other one BLN−1 of the outermost bit lines BL0 and BLN−1 In the plurality of bit lines BL<0:N−1>.

In the dummy bit line driving unit 400, a dummy bias unit 410 for providing a dummy bias to the first dummy bit line DBL0 and the second dummy bit line DBL1 may be coupled to the first dummy bit line DBL0 and the second dummy bit line DBL1 through a first PMOS transistor MP1 and a second PMOS transistor MP2 having a source-drain path.

The first dummy bit line DBL0 may be coupled to the bit line BL1 adjacent to the outermost bit line BL0 through a first NMOS transistor MN1 having a source-drain path. The second dummy bit line DBL1 may be coupled to the bit line BLN−2 adjacent to the outermost bit line BLN−1 through a second NMOS transistor MN2 having a source-drain path. Each of the first and second PMOS transistors MP1 and MP2 and the first and second NMOS transistors MN1 and MN2 may have a gate responding to a dummy line control signal DL_CTRL.

When not in the wafer burn-in test, the dummy bias unit 410 may provide the bit line precharge voltage VBLP. The dummy bias unit 410 may provide the core voltage VCORE and the ground voltage VSS to the dummy bit lines DBL0 and DBL1.

Operation of the dummy bias unit 410 will be described.

The dummy line control signal DL_CTRL is activated to the high level in the test mode and the first dummy bit line DBL0 may be decoupled from the dummy bias unit 410 and coupled to the bit line BL1 adjacent to the outermost bit line BL0. The second dummy bit line DBL1 may be decoupled from the dummy bias unit 410 and coupled to the bit line BLN-2 adjacent to the outermost bit line BLN-1.

When the dummy line control signal DL_CTRL is deactivated to the low level, each of the first dummy bit line DBL0 and the second dummy bit line DBL1 may be decoupled from the adjacent bit lines BL1 and BLN-2 and coupled to the dummy bias unit 410.

Therefore, the first dummy bit line DBL0 and the second dummy bit line DBL1 may be coupled to the adjacent bit lines BL1 and BLN-2, respectively, and alternatively provided with the first precharge voltage VBLP0 and the second precharge voltage VBLP1.

In conventional semiconductor memory devices, bias provided to the dummy bit lines is fixed and thus cannot be adjusted in the wafer burn-in test. In accordance with embodiments of the present invention, the dummy bit lines each may be coupled to the bit line adjacent to the outermost bit line, which is also adjacent to the dummy bit line, and thus the bias may be separately adjusted.

Figure 5:
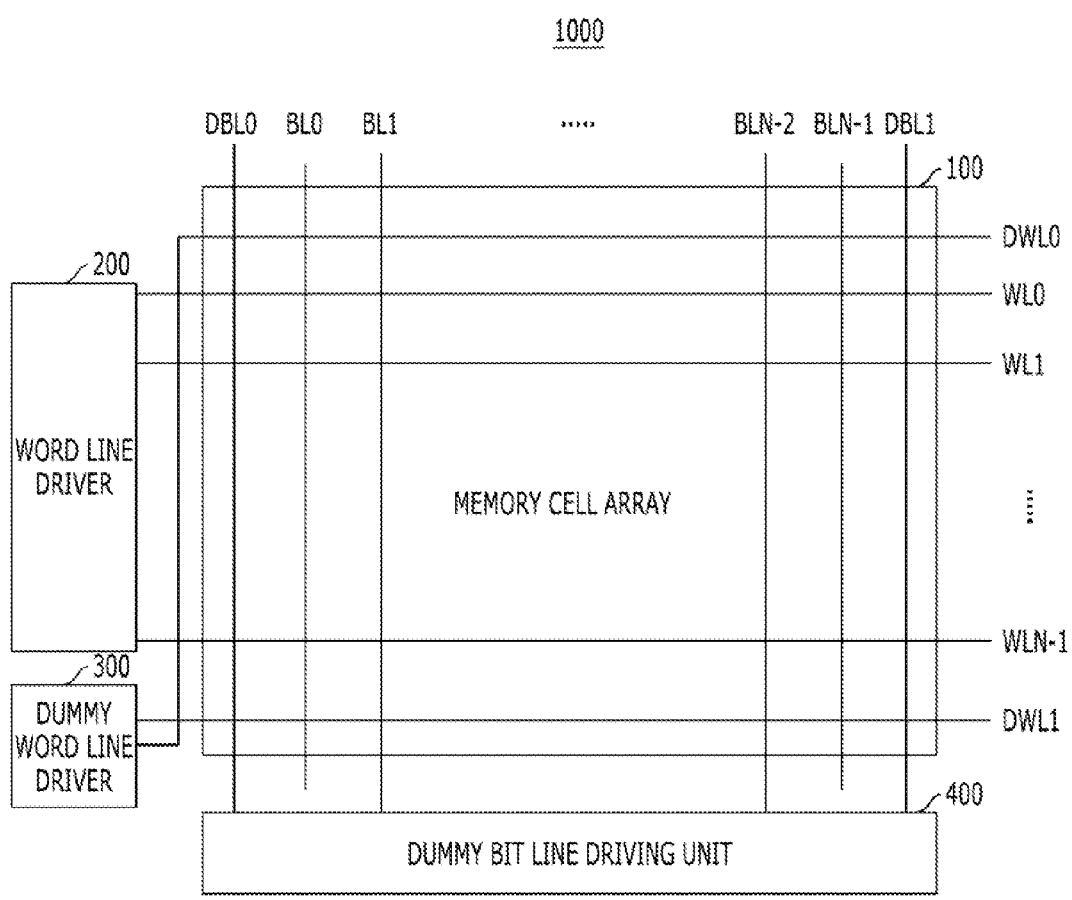
FIG. 5 is a block diagram illustrating a semiconductor memory device in accordance with an exemplary embodiment of the present invention.

FIG. 5 shows an even number of the plurality of bit lines BL<0:N-1>, in which the outermost bit lines BL0 and BLN-1 may be provided with the first precharge voltage VBLP0 and the second precharge voltage VBLP1, respectively. The semiconductor memory device 1000, which may have an odd number of bit lines BL<0:N-1>, may still perform the same wafer burn-in test as in the case of an even number of bit lines BL<0:N-1>. In the semiconductor memory device 1000 having an odd number of the plurality of bit lines BL<0:N-1>, the outermost bit lines may be provided with the same bias.

In accordance an embodiment of the present invention, the semiconductor memory device 1000 in the wafer burn-in test may control the dummy bit lines by coupling each of the dummy bit lines to the adjacent bit line disposed adjacent to the outermost bit line on the inner side of the memory cell array. In the conventional semiconductor memory device, a bias provided to the dummy bit lines is fixed and thus cannot be separately adjusted in the wafer burn-in test. A stress may be provided to the oxide of the cell capacitor while an equal stress is provided to the normal cells (not shown) and the dummy cells (not shown) through application of equal stress to the connected bit line and the dummy bit line.

FIG. 5 is a block diagram illustrating a semiconductor memory device in accordance with a third exemplary embodiment of the present invention.

The semiconductor memory device may control a dummy bit line and a dummy word line during the wafer burn-in test.

Referring to FIG. 5, the semiconductor memory device 1000 may include a memory cell array 100, a word line driver 200, a dummy word line driver 300 and a dummy bit line driving unit 400.

The memory cell array 100 may include a plurality of word lines WL<0:N-1>, a first dummy word line DWL0 disposed adjacent to the uppermost word line WL0 of the plurality of word lines WL<0:N-1> and a second dummy word line DWL1 disposed adjacent to the lowermost word line WLN-1 of the plurality of word lines WL<0:N-1>.

Also, the memory cell array 100 may include the plurality of bit lines BL<0:N-1> and one or more dummy bit lines DBL0 and DBL1 disposed at the border of the memory cell array 100 and adjacent to the outermost bit lines BL0 and BLN-1 of the plurality of bit lines BL<0:N-1>.

The word line driver 200 may operate in order to selectively activate the plurality of word lines WL<0:N-1> for the wafer burn-in test. The word line driver 200 shown in FIG. 5 is the same as the word line driver 200 shown in FIG. 1.

The dummy word line driver 300 of the semiconductor memory device 1000 may separately drive the first dummy word line DWL0 and the second dummy word line DWL1 such as described with reference to FIG. 1.

The first dummy word line DWL0 and the second dummy word line DWL1 may be selectively activated in response to the test mode selection signal TM_N in the test mode. Therefore, a word line corresponding to the test address T_ADD and the first dummy word line DWL0 or the second dummy word line DWL1 corresponding to the test address T_ADD may be activated simultaneously.

The stress bias may be applied to the activated word line and dummy word line and another word line and dummy word line may be activated in response to the test address T_ADD, which is subsequently applied.

The first dummy word line DWL0 and the second dummy word line DWL1 may be provided with stress biases complementary to each other. In other words, in a case where groups of word lines corresponding to the test address T_ADD among the plurality of word lines are alternatively activated in the wafer burn-in test, the first dummy word line DWL0 or the second dummy word line DWL1 may be selectively activated together with the activated word lines. Therefore, the first dummy word line DWL0 and the second dummy word line DWL1 may be activated separately and thus the normal cells and the dummy cells in the memory cell array may be equally stressed out and the wafer burn-in test may be performed more effectively. The dummy word line driver 300 shown in FIG. 5 is the same as the dummy word line driver 300 described with reference to FIGS. 1 and 2.

The dummy bit line driving unit 400 may electrically couple the dummy bit line DBL0 to the adjacent bit line BL1 adjacent to the outermost bit line BL0 for the wafer burn-in test. Also, the dummy bit line driving unit 400 may electrically couple the other dummy bit line DBL1 to the adjacent bit line BLN-2 adjacent to the other outermost bit line BLN-1.

A pair of bit lines of the plurality of bit lines BL<0:N-1>, which are adjacent to each other, may be provided with the first precharge voltage VBLP0 and the second precharge voltage VBLP1, which are different from each other. Thus, equal stress may be provided to the adjacent cells when the first precharge voltage VBLP0 and the second precharge voltage VBLP1 are alternatively provided in the wafer burn-in test. The dummy bit line driving unit 400 shown in FIG. 5 is the same as the dummy bit line driving unit 400 described with reference to FIGS. 3 and 4.

In accordance with an embodiment of the present invention, the semiconductor memory device 1000 may perform the wafer burn-in test by controlling the dummy word line only, as described with reference to FIGS. 1 and 2, and by controlling the dummy bit line only, as described with reference to FIGS. 3 and 4.

In accordance with an exemplary embodiment of the present invention, the semiconductor memory device may separately control the dummy word line and the dummy bit line. Thus, the semiconductor memory device may apply the equalized stress to all of the cells during the wafer burn-in test and increase the reliability thereof.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
   a memory cell array including a plurality of word lines, a first dummy word line, a second dummy word line, a plurality of bit lines and one or more dummy bit lines adjacent to outermost bit lines of plurality of bit lines;
   a dummy word line driver for driving the first dummy word line and the second dummy word line separately during a wafer burn-in test where the word lines are driven by group; and
   a dummy bit line driving unit for coupling each of the dummy bit lines to a bit line adjacent to an outermost bit lines, which is adjacent to the dummy bit line among the outermost bit lines, during the wafer burn-in test.

2. The semiconductor memory device of claim 1, wherein the first dummy word line and the second dummy word line are respectively provided with levels of stress biases that are complementary to each other.

3. The semiconductor memory device of claim 1, further comprising a word line driver for selectively activating the plurality of word lines for the wafer burn-in test.

4. The semiconductor memory device of claim 1, wherein the first dummy word line is adjacent to a uppermost word line of the plurality of word lines, and the second dummy word line is adjacent to a lowermost word line of the plurality of word lines in the memory cell array.

5. The semiconductor memory device of claim 4, wherein the dummy word line driver drives the first dummy word line when the lowermost word line is driven, and drives the second dummy word line when the uppermost word line is driven for the wafer burn-in test.

6. The semiconductor memory device of claim 4, wherein the dummy word line driver includes:
   a first dummy word line driver for activating the first dummy word line based on a first control address in response to a test mode selection signal; and
   a second dummy word line driver for activating the second dummy word line based on a second control address in response to the test mode selection signal.

7. The semiconductor memory device of claim 6, wherein the first control address is the same as an address for activating the lowermost word line, and
   the second control address is the same as an address for activating the uppermost word line.

* * * * *